(12) United States Patent
Yang

(10) Patent No.: US 7,990,714 B2
(45) Date of Patent: Aug. 2, 2011

(54) HEAT DISSIPATION DEVICE AND FASTENERS THEREOF

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 186 days.

(21) Appl. No.: 12/510,227

(22) Filed: Jul. 27, 2009

(65) Prior Publication Data

US 2010/0254083 A1   Oct. 7, 2010

(30) Foreign Application Priority Data

Apr. 1, 2009 (CN) .................... 2009 1 0301281

(51) Int. Cl.
*H05K 7/20* (2006.01)
*F28F 7/00* (2006.01)
*H01L 23/34* (2006.01)
*F16B 37/02* (2006.01)

(52) U.S. Cl. .............. 361/700; 361/679.47; 361/679.52; 165/80.4; 165/80.5; 165/104.33; 257/715; 257/718; 257/719; 257/E23.088; 174/15.2; 411/172

(58) Field of Classification Search ............. 361/679.47, 361/679.52, 700; 165/80.4–80.5, 104.33, 165/185; 257/715, 718–719, 722, E23.088; 174/15.2, 252; 411/172
See application file for complete search history.

(56) References Cited

U.S. PATENT DOCUMENTS

| | | | | |
|---|---|---|---|---|
| 6,196,781 | B1 * | 3/2001 | Yang ............................. | 411/384 |
| 6,781,835 | B2 * | 8/2004 | Hashimoto et al. ........... | 361/697 |
| 7,397,667 | B2 * | 7/2008 | Lin et al. ....................... | 361/719 |
| 7,701,709 | B2 * | 4/2010 | Tomioka et al. ......... | 361/679.47 |
| 2004/0001316 | A1 * | 1/2004 | Kamikawa et al. ........... | 361/700 |
| 2007/0236885 | A1 * | 10/2007 | Zhao et al. .................... | 361/700 |
| 2008/0007915 | A1 * | 1/2008 | Chen ............................. | 361/701 |
| 2008/0123298 | A1 * | 5/2008 | Takeguchi et al. ............ | 361/702 |
| 2010/0236756 | A1 * | 9/2010 | Yang ............................. | 165/80.3 |
| 2010/0246129 | A1 * | 9/2010 | Hongo .......................... | 361/700 |

* cited by examiner

*Primary Examiner* — Zachary M Pape
(74) *Attorney, Agent, or Firm* — Frank R. Niranjan

(57) ABSTRACT

A heat dissipation device includes a heat sink, a heat absorbing plate, a heat pipe thermally connecting the heat sink and the absorbing plate, a pressing plate secured to the heat absorbing plate and pressing an end of the heat pipe to the heat absorbing plate, and a plurality of fasteners extending through the pressing plate to secure the end of the heat pipe, the heat absorbing plate and the pressing plate to a printed circuit board. Each of the fasteners includes a connecting portion extending through the pressing plate, a first operating portion extending from the connecting portion, and a second operating portion formed at an end face of the first operating portion. The first and second operating portions are configured to be operated by different tools.

5 Claims, 3 Drawing Sheets

HEAT DISSIPATION DEVICE AND FASTENERS THEREOF

BACKGROUND

1. Technical Field

The present disclosure relates generally to a heat dissipation device, and more particularly to a heat dissipation device having fasteners for facilitating installation of the heat dissipation device.

2. Description of Related Art

Generally, in order to ensure the normal running of an electronic device, a heat dissipation device is used to dissipate heat generated by the electronic device.

When installing the heat dissipation device, a plurality of fasteners such as screws are applied. The screws are different from each other according to the positions of the heat dissipation device the screws are located. Therefore, a plurality of different tools should be applied to handle the screws and should be alternated from one to another during the installation of the heat dissipation device, which is tiresome and inconvenient.

What is need therefore is a heat dissipation device having a design which makes installation of the heat dissipation device be convenient and easy.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
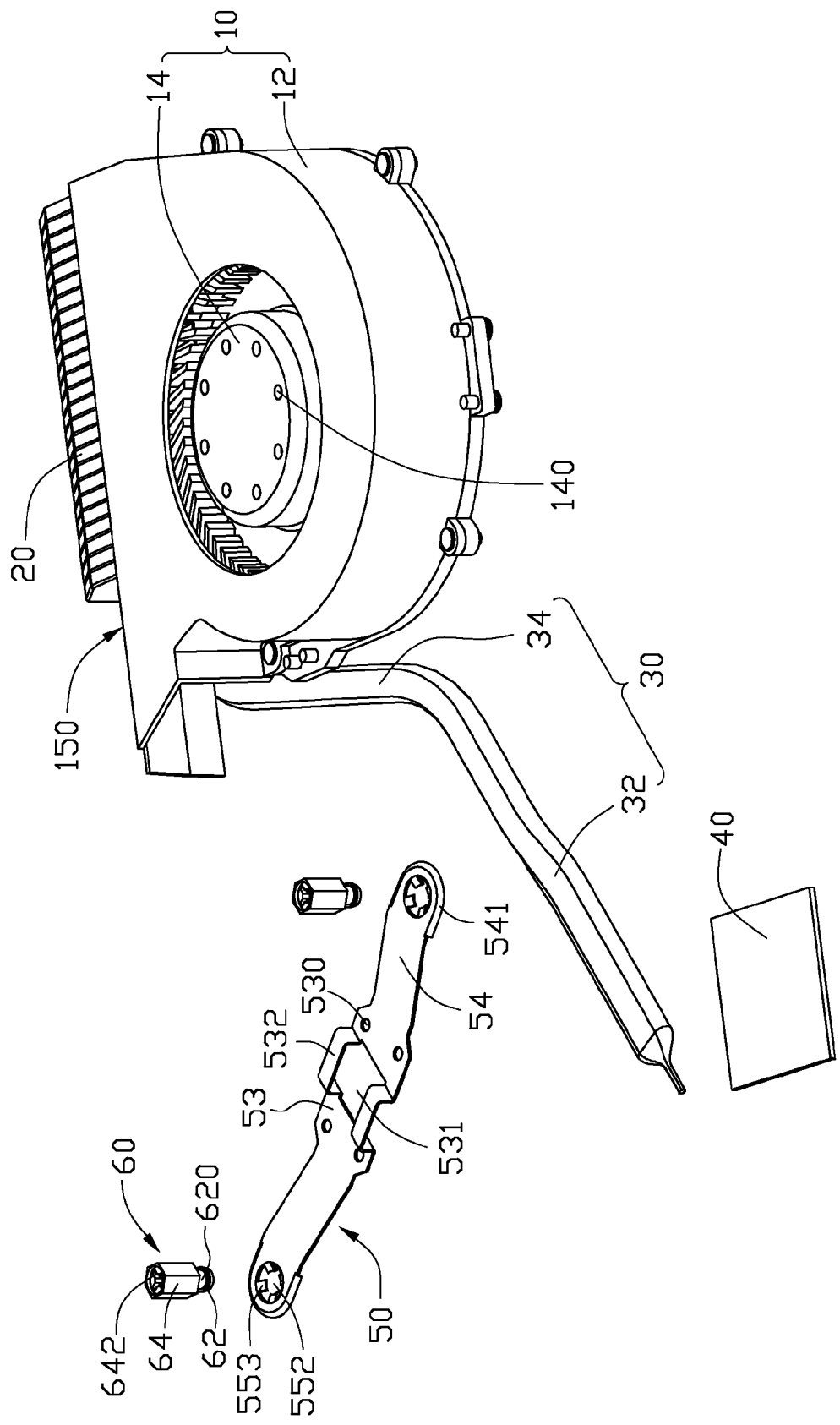
FIG. 1 is an isometric, exploded view of a heat dissipation device in accordance with an embodiment of the present disclosure.
Figure 2:
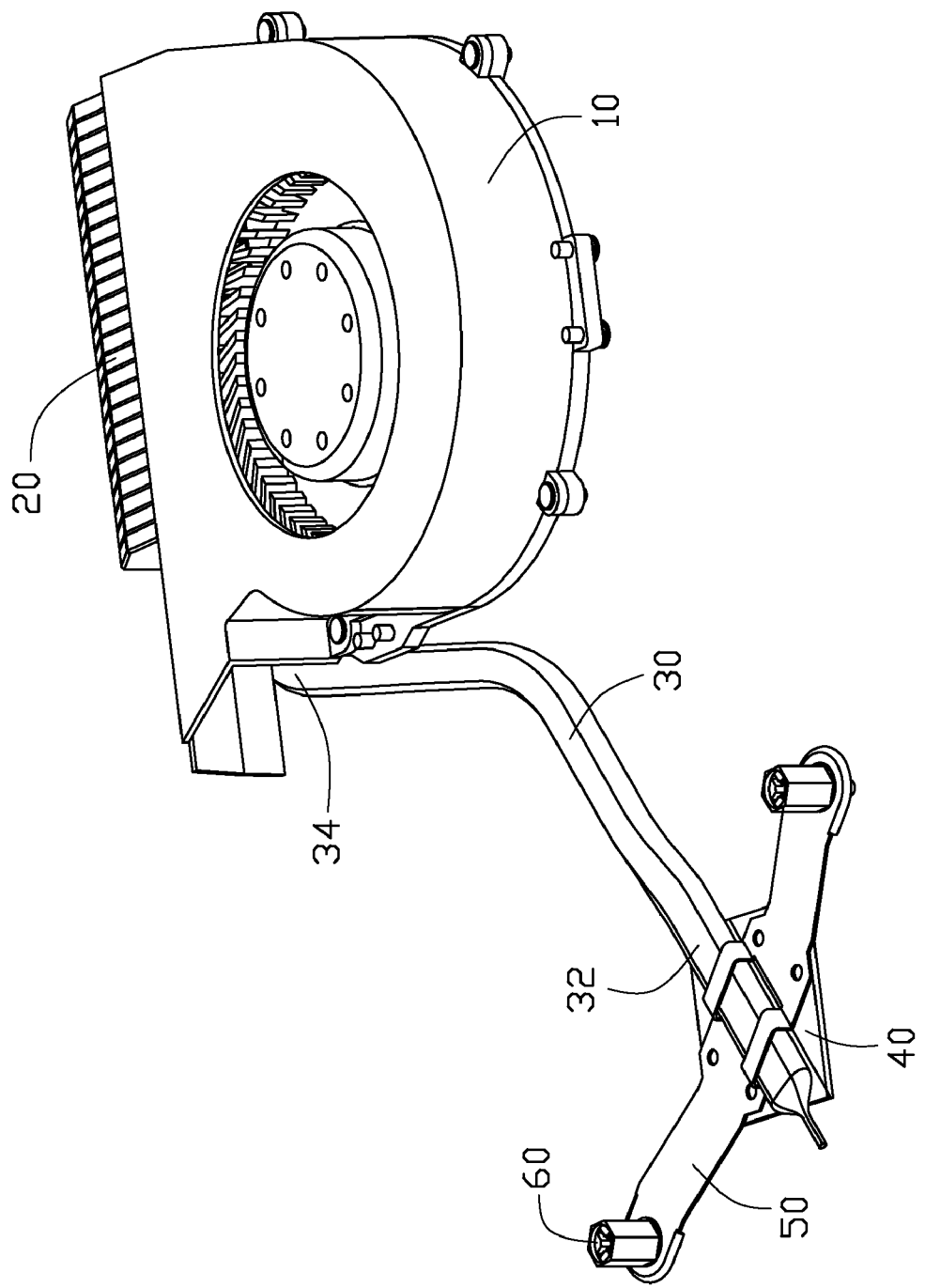
FIG. 2 is an assembled view of the heat dissipation device of FIG. 1.

FIGS. 1 and 2 illustrate a heat dissipation device in accordance with an embodiment of the present disclosure. The heat dissipation device dissipates heat from a heat-generating component such as a CPU (not shown). The heat dissipation device comprises a centrifugal fan 10, a heat sink 20, a heat pipe 30, a heat absorbing plate 40, a pressing plate 50 and two fasteners 60 locking on the pressing plate 50. The centrifugal fan 10 is located at a side of the heat sink 20 to generate airflow flowing through the heat sink 20. The heat absorbing plate 40 contacts the heat-generating component and absorbs heat therefrom. The heat pipe 30 has one end connected to the heat sink 20 and another end attached to the heat absorbing plate 40. The pressing plate 50 presses on the another end of the heat pipe 30 to combine the heat absorbing plate 40 and the heat pipe 30 together and secures the heat absorbing plate 40 and the heat pipe 30 via the fasteners 60 onto a printed circuit board (not shown) on which the heat-generating component is mounted.

The centrifugal fan 10 comprises a frame 12 and an impeller 14 received in the frame 12. A round air inlet 140 is defined in a top of the frame 12. A straight air outlet 150 is defined at a rear side of the frame 12.

The heat sink 20 comprises a plurality of parallel fins stacked together. The heat sink 20 is located at the rear side of the centrifugal fan 10 and has a shape similar to that of the outlet 150 of the centrifugal fan 10.

The heat absorbing plate 40 is a substantially square plate and made of a material having a high heat conductivity.

The heat pipe 30 has a substantially Z shape and forms an evaporating section 32 and a condensing section 34 at two ends thereof.

The pressing plate 50 is an elongated strip and comprises an abutting portion 53 and two handling portions 54 extending from two opposite ends of the abutting portion 53. The abutting portion 53 abuts against the heat pipe 30 and the heat absorbing plate 40, with four riveting holes 530 defined at corners thereof. An arch portion 532 protrudes upwardly from a middle of the abutting portion 53 for the evaporating section 32 of the heat pipe 30 extending through. An opening 531 is defined in the center of the arch portion 532.

Free ends of the two handling portions 54 are slightly tilted up. A flange 541 is formed at edges of the free end of each handling portion 54 to increase strength thereof. A round hole 552 is defined in each free end of the handling portions 54. A plurality of teeth 553 are evenly formed at a periphery of the hole 552 and extend inwardly and downwardly towards the center of the hole 552. Free ends of the teeth 553 are beneath the hole 552 and define portions of a circle, which is located under the hole 552 and has a diameter smaller than that of the hole 552. When the fastener 60 is pushed into the hole 552, the free ends of the teeth 553 are moved downwardly and outwardly firstly and then spring back to their original positions, as disclosed in detail herebelow.

Figure 3:
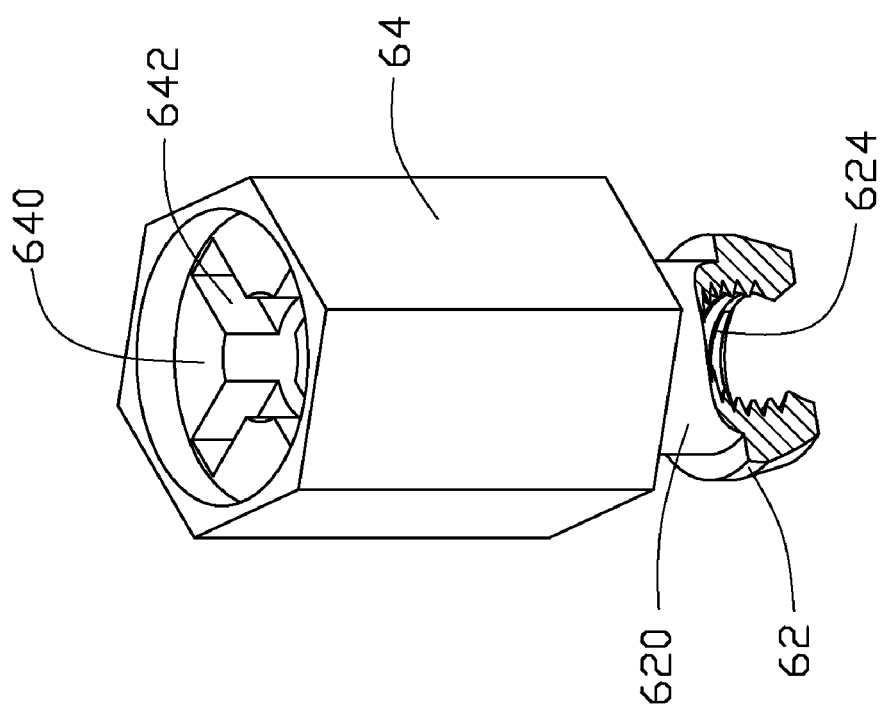
FIG. 3 is an isometric view of a fastener of the heat dissipation device of FIG. 1, with a part thereof being cut off to show an inner structure thereof.

Also referring to FIG. 3, each fastener 60 comprises a connecting portion 62, a first operating portion 64 extending upwardly from a top of the connecting portion 62, and a second operating portion 642 formed at a top end face of the first operating portion 64. The connecting portion 62 has a substantially columned shape and the first operating portion 64 has a substantially prism shape. The first operating portion 64 has a diameter larger than that of the connecting portion 62.

A ring-shaped slot 620 is defined to be recessed in an outer surface of the connecting portion 62. The slot 620 is located immediately below the first operating portion 64. A threaded hole 624 is defined in the fastener 60 and extends in the connecting portion 62. A bolt (not shown) formed on the printed circuit board engages in the threaded hole 624 such that the fastener 60 is secured on the printed circuit board. Understandably the depth of the threaded hole 624 depends on the height of the bolt and the threaded hole 624 can also extend into the first operating portion 64 in an alternative embodiment.

The first operating portion 64 is a hexagonal prism in the present embodiment. Understandably, the first operating portion 64 can be other prisms in alternative embodiments. A round recess 640 is defined in the center of a top end face of the first operating portion 64. The second operating portion 642 is a cross groove defined in the recess 640. It is noted that the cross groove comprises two straight grooves perpendicular to each other. A user can handle the first operating portion 64 with a first tool such as a spanner, and alternatively handle the second operating portion 642 with a second tool such as a crosshead screwdriver or a slot head screwdriver to install the fastener 60 onto the printed circuit board. Person skilled in the art can also change the second operating portion 642 to be other shapes without departing from the spirit of the disclosure to fulfill the operation of the fastener 60 by different tools. For example, the second operating portion 642 can be a straight groove. The recess 640 prevents the screwdriver from sliding away from the second operating portion 642 when in operation.

In pre-assembly of the heat dissipation device, the connecting portion 62 of the fastener 60 is inserted into the hole 552 of the pressing plate 50. The first operating portion 64 abuts against on the pressing plate 50 to restrict the downward movement of the fastener 60. The teeth 553 extend in the slot 620 and grasp on the connecting portion 62 to restrict the upward movement of the fastener 60. During the insertion of the fastener 60 into the hole 552, the teeth 553 are first pressed to move downwardly and outwardly by a bottom of the connecting portion 62; then the teeth 553 spring back to their original positions to engage in the slot 620 when the fastener 60 is inserted downwardly a distance that the free ends of the teeth 553 are aligned with the slot 620.

In assembly of the heat dissipation device, the heat sink 20 is located at the outlet 150 of the centrifugal fan 10. The evaporating section 32 of the heat pipe 30 is arranged on the heat absorbing plate 40, and the condensing section 34 is attached to a bottom of the heat sink 20. The pressing plate 50 presses on the evaporating section 32 of the heat pipe 30, with rivets (not shown) riveting in the holes 530 of the pressing plate 50 and the heat absorbing plate 40 to securely connect the pressing plate 50, the evaporating section 32 of the heat pipe 30 and the heat absorbing plate 40 together.

When installing the heat dissipation device onto the printed circuit board, the heat absorbing plate 40 is attached to the heat-generating component. The centrifugal fan 10 is secured on the printed circuit board by other fastening members such as screws, and the heat pipe 30, the heat absorbing plate 40 and the pressing plate 50 are secured thereon by the two fasteners 60. Since the fasteners 60 can be operated by different tools, an operation flexibility of the fasteners 60 is increased. That is, the installation of the heat dissipation device onto the printed circuit board becomes more convenient.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device comprising: a heat sink; a heat absorbing plate; a heat pipe with one end thereof connected to the heat sink and another end thereof attached to the heat absorbing plate; a pressing plate secured to the heat absorbing plate and pressing the another end of the heat pipe to the heat absorbing plate; and a plurality of fasteners extending through the pressing plate for securing the another end of the heat pipe, the heat absorbing plate and the pressing plate to a printed circuit board; wherein each of the fasteners comprises a connecting portion extending through the pressing plate, a first operating portion extending from the connecting portion and abutting against the pressing plate, and a second operating portion formed at an end face of the first operating portion, the first and second operating portions configured to be operated by different tools, wherein a plurality of holes are defined in the pressing plate for the connecting portions of the fasteners to extend therethrough, and a slot is defined in an outer surface of each of the connecting portions, the pressing plate forming a plurality of teeth in each of the holes, the teeth engaging in the slot to block the pressing plate from separating from the fasteners, and wherein a recess is defined in the end face of the first operating portion, and the second operating portion is defined in the recess.

2. The heat dissipation device as claimed in claim 1, further comprising a centrifugal fan with an air outlet thereof facing the heat sink.

3. The heat dissipation device as claimed in claim 1, wherein the first operating portion has a prism shape.

4. The heat dissipation device as claimed in claim 1, wherein the second operating portion has a straight groove defined therein.

5. The heat dissipation device as claimed in claim 1, wherein the second operating portion has a cross groove defined therein.

* * * * *